United States Patent
Yeh et al.

(10) Patent No.: US 9,490,248 B2
(45) Date of Patent: Nov. 8, 2016

(54) POWER CELL, POWER CELL CIRCUIT FOR A POWER AMPLIFIER AND A METHOD OF MAKING AND USING A POWER CELL

(71) Applicants: Tzu-Jin Yeh, Hsinchu (TW); Chewn-Pu Jou, Hsinchu (TW); Jun-De Jin, Hsinchu (TW)

(72) Inventors: Tzu-Jin Yeh, Hsinchu (TW); Chewn-Pu Jou, Hsinchu (TW); Jun-De Jin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 290 days.

(21) Appl. No.: 13/753,995

(22) Filed: Jan. 30, 2013

(65) Prior Publication Data

US 2014/0184275 A1    Jul. 3, 2014

Related U.S. Application Data

(60) Provisional application No. 61/747,642, filed on Dec. 31, 2012.

(51) Int. Cl.

| | | |
|---|---|---|
| *H01L 29/66* | (2006.01) | |
| *H01L 29/772* | (2006.01) | |
| *H01L 27/06* | (2006.01) | |
| *H03K 17/10* | (2006.01) | |
| *H01L 29/78* | (2006.01) | |
| *H01L 29/06* | (2006.01) | |
| *H01L 29/10* | (2006.01) | |

(52) U.S. Cl.
CPC ....... *H01L 27/0629* (2013.01); *H01L 29/0653* (2013.01); *H01L 29/1087* (2013.01); *H01L 29/66484* (2013.01); *H01L 29/7832* (2013.01); *H03K 17/102* (2013.01); *H01L 29/66636* (2013.01); *H03K 2217/0018* (2013.01)

(58) Field of Classification Search
None
See application file for complete search history.

(56) References Cited

U.S. PATENT DOCUMENTS

| | | | | | |
|---|---|---|---|---|---|
| 4,176,368 | A | * | 11/1979 | Compton | 257/285 |
| 4,550,291 | A | * | 10/1985 | Millaway | H03F 1/226 330/277 |
| 4,598,253 | A | * | 7/1986 | Reindel | H03F 3/45376 330/253 |
| 4,912,053 | A | * | 3/1990 | Schrantz | 438/188 |
| 4,958,204 | A | * | 9/1990 | Blanchard | H01L 21/28185 257/261 |
| 5,012,305 | A | * | 4/1991 | Khadder et al. | 257/270 |
| 7,943,971 | B1 | * | 5/2011 | Kapoor et al. | 257/256 |

(Continued)

OTHER PUBLICATIONS

Shi, Yun et al., "A Cost-Competitive High Performance Junction-FET (JFET) in CMOS Process for RF & Analog Applications", 2010 IEEE Radio Frequency Integrated Circuits Symposium, pp. 237-240.

*Primary Examiner* — Steven Loke
*Assistant Examiner* — Sitaramarao S Yechuri
(74) *Attorney, Agent, or Firm* — Hauptman Ham, LLP

(57) ABSTRACT

A power cell including an isolation region having a first dopant type formed in a substrate. The power cell further includes a bottom gate having a second dopant type different from the first dopant type formed on the isolation region and a channel layer having the first dopant type formed on the bottom gate. The power cell further includes source/drain regions having the first dopant type formed in the channel layer and a first well region having the second dopant type formed around the channel layer and the source/drain regions, and the first well region electrically connected to the bottom gate. The power cell further includes a second well region having the first dopant type formed around the channel layer and contacting the isolation region and a gate structure formed on the channel layer.

35 Claims, 5 Drawing Sheets

(56) References Cited

U.S. PATENT DOCUMENTS

| | | |
|---|---|---|
| 7,969,243 B2 | 6/2011 | Bracale et al. |
| 2007/0262793 A1* | 11/2007 | Kapoor ............... H01L 29/8086 326/101 |
| 2008/0048214 A1* | 2/2008 | Kobayashi .................... 257/256 |
| 2008/0128762 A1* | 6/2008 | Vora ..................... H01L 29/808 257/288 |
| 2008/0273409 A1* | 11/2008 | Thummalapally ............. 365/222 |
| 2010/0019249 A1* | 1/2010 | Mouli ............................. 257/77 |
| 2010/0032731 A1* | 2/2010 | Babcock ............... H01L 27/095 257/280 |
| 2010/0271133 A1* | 10/2010 | Bracale .............. H01L 27/0617 330/277 |
| 2011/0006845 A1* | 1/2011 | Korner ..................... H03F 1/22 330/277 |

* cited by examiner

POWER CELL, POWER CELL CIRCUIT FOR A POWER AMPLIFIER AND A METHOD OF MAKING AND USING A POWER CELL

BACKGROUND

A power amplifier is used in a variety of devices to increase a power of an input/output signal. The power amplifier is implemented using a power cell connected to a power supply. The power cell is configured to match a shape of the signal at a voltage level of the power supply, thereby changing the power of the signal to the voltage level of the power supply. The higher power signal is capable of being transmitted to another device or used within a device containing the power amplifier.

The power cell is subjected to high voltages during amplification of the signal which increases a risk of breakdown in the power cell. In some instances, breakdown is a result of hot carrier effect where a charge carrier, e.g., an electron or a hole, escapes from a channel of the power cell and enters another layer, e.g., a gate dielectric or a buried well. The hot carrier damages the other layer and causes short circuiting in some instances. The hot carrier effect is a concern in power cells because high magnitude voltages are applied to the power cell to increase the power of the signal.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
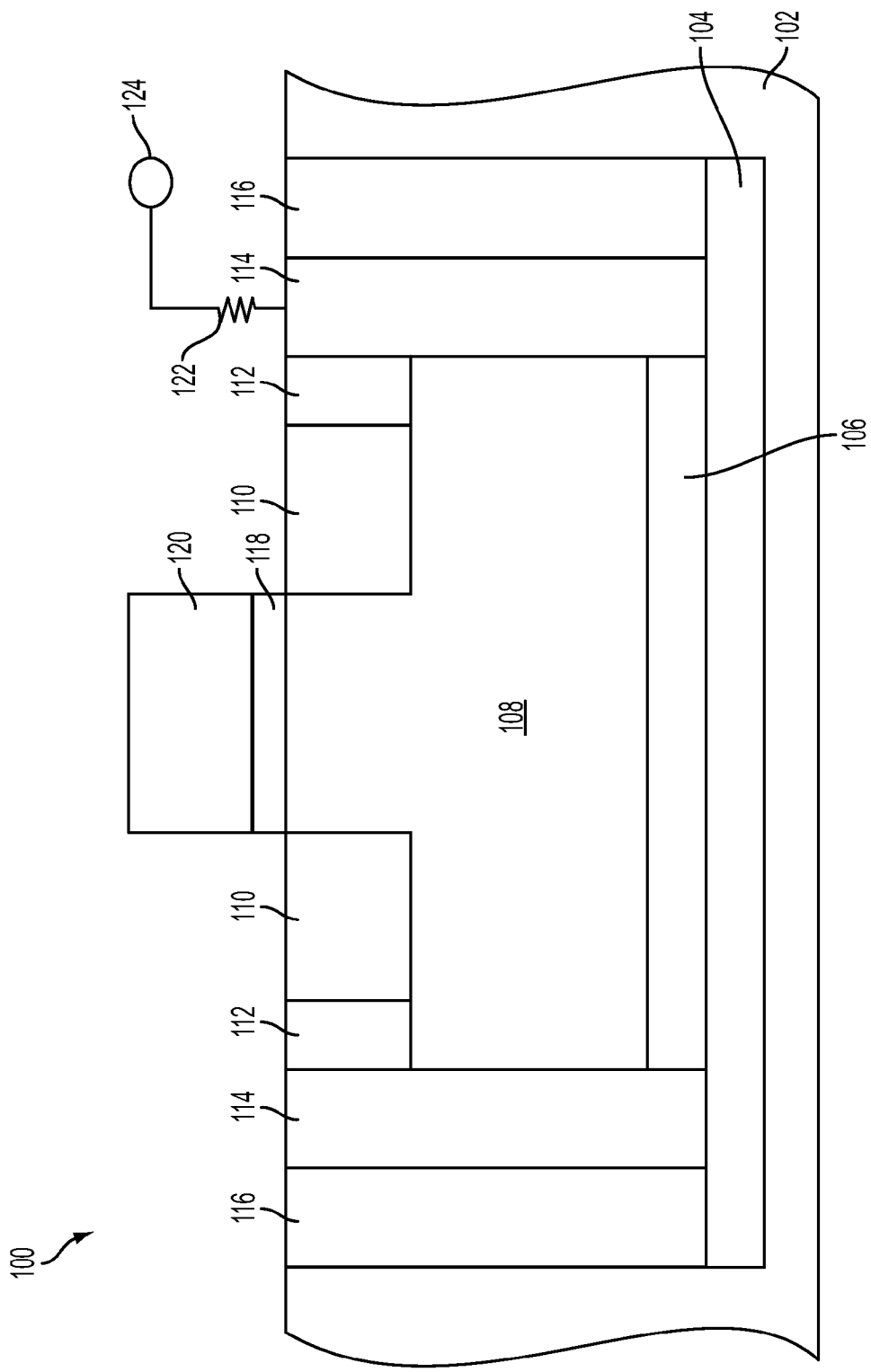
FIG. 1 is a cross sectional view of a power cell in accordance with one or more embodiments.

FIG. 1 is a cross sectional view of a power cell 100 in accordance with one or more embodiments. Power cell 100 includes a substrate 102 and an isolation region 104 formed in the substrate. Power cell 100 further includes a bottom gate 106 formed on isolation region 104. Power cell 100 further includes a channel layer 108 formed on bottom gate 106. Source/drain regions 110 are formed on channel layer 108. Non-conductive regions 112 are formed on channel layer 108 between source/drain regions 110 and a first well 114. First well 114 is around an outer sidewall of non-conductive regions 112 and channel layer 108 and contacts the outer sidewall of the non-conductive regions and the channel layer. First well 114 is also around an outer sidewall of bottom gate 106 and contacts the outer sidewall of the bottom gate and a top surface of isolation region 104. A second well 116 around an outer sidewall of first well 114 and contacts the outer sidewall of the first well and the top surface of isolation region 104. Power cell 100 further includes a gate dielectric layer 118 formed over a top surface of channel layer 108 between source/drain regions 110. A gate electrode 120 is formed on gate dielectric layer 118. A resistor 122 has a first side connected to a top surface of first well 114 and a second side connected to a bias source 124. In some embodiments, power cell 100 includes another resistor connected to a top surface of gate electrode 120.

Isolation region 104, channel layer 108, source/drain regions 110 and second well 116 have a first dopant type. Bottom gate 106 and first well 114 have a second dopant type different from the first dopant type. In some embodiments, the first dopant type is an n-type dopant. In some embodiments, the first dopant type is a p-type dopant.

In some embodiments, substrate 102 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 102 is a doped substrate. In some embodiments, substrate 102 is a high resistance substrate. In some embodiments, a resistance of substrate 102 is equal to or greater than 5K ohm-cm. If the resistance is less than 5K ohm-cm, current leakage through substrate 102 at high operating voltages causes power cell 100 to function improperly, in some embodiments. In some embodiments having the high resistance substrate, power cell 100 increases power added efficiency in comparison with embodiments which lack the high resistance substrate. In some embodiments having the high resistance substrate, power cell 100 provides a more uniform output voltage than embodiments which lack the high resistance substrate.

Isolation region 104 comprises a doped layer having the first dopant type. In some embodiments, isolation region 104 comprises an epi-layer grown over substrate 102. In some embodiments, the epi-layer is doped by adding dopants during the epitaxial process. In some embodiments, the epi-layer is doped by ion implantation after the epi-layer is formed. In some embodiments, isolation region 104 is formed by doping substrate 102. In some embodiments, the doping is performed by ion implantation. In some embodiments, isolation region 104 has a dopant concentration ranging from $1\times10^{12}$ atoms/cm$^3$ to $1\times10^{14}$ atoms/cm$^3$. If the dopant concentration is below $1\times10^{12}$ atoms/cm$^3$, isolation region 104 does not provide sufficient isolation between substrate 102 and bottom gate 106, in some embodiments. If the dopant concentration is above $1\times10^{14}$ atoms/cm$^3$, isolation region 104 would provide a path for current leakage from bottom gate 106 to substrate 102, in some embodiments.

Bottom gate 106 comprises a doped layer having the second dopant type. In some embodiments, bottom gate 106 comprises an epi-layer grown over isolation region 104. In some embodiments, the epi-layer is doped by adding dopants during the epitaxial process. In some embodiments, the epi-layer is doped by ion implantation after the epi-layer is formed. In some embodiments, bottom gate 106 is formed by doping substrate 102. In some embodiments, the doping is performed by ion implantation. In some embodiments, bottom gate 106 has a dopant concentration ranging from $1\times10^{16}$ atoms/cm$^3$ to $1\times10^{18}$ atoms/cm$^3$. If the dopant concentration is below $1\times10^{16}$ atoms/cm$^3$, bottom gate 106 does not provide sufficient conductivity to form a conductive path from channel layer 108 to bias source first well 114 and bias source 124, in some embodiments. If the dopant concentration is above $1\times10^{18}$ atoms/cm$^3$, bottom gate 106 would provide a path for current leakage from channel layer 108 to first well 114, in some embodiments.

Channel layer 108 comprises a doped layer having the first dopant type. In some embodiments, channel layer 108 comprises an epi-layer grown over bottom gate 106. In some embodiments, the epi-layer is doped by adding dopants during the epitaxial process. In some embodiments, the epi-layer is doped by ion implantation after the epi-layer is formed. In some embodiments, channel layer 108 is formed by doping substrate 102. In some embodiments, the doping is performed by ion implantation. In some embodiments, channel layer 108 has a dopant concentration ranging from $1\times10^{16}$ atoms/cm$^3$ to $1\times10^{18}$ atoms/cm$^3$. If the dopant concentration is below $1\times10^{16}$ atoms/cm$^3$, channel layer 108 does not provide sufficient conductivity to form a conductive path between source/drain regions 110, in some embodiments. If the dopant concentration is above $1\times10^{18}$ atoms/cm$^3$, channel layer 108 would provide a path for current leakage between source/drain regions 110, in some embodiments.

Channel layer 108 forms a three-dimensional channel. Channel layer 108 is considered a three-dimensional channel because a channel length is capable of being changed in a direction between source/drain regions 110 and in a direction from bottom gate 106 to gate dielectric layer 118. The three-dimensional channel of channel layer 108 places a pinch-off point further away from gate dielectric layer 118 than other metal oxide semiconductor (MOS) transistor designs. By locating the pinch-off point further from gate dielectric layer 118, the hot carrier effect is reduced and power cell 100 is capable of handling higher power applications than other MOS transistor designs.

Source/drain regions 110 comprise regions having the first dopant type. In some embodiments, source/drain regions are formed by etching channel layer 108 to form a trench and growing the source/drain regions in the trench. In some embodiments, dopants are introduced during the growing of source/drain regions 110. In some embodiments, source/drain regions 110 are doped following completion of the growing process. In some embodiments, source/drain regions 110 are formed by doping channel layer 108. Source/drain regions 110 have a higher dopant concentration than channel layer 108. In some embodiments, channel layer 108 has a dopant concentration ranging from $1\times10^{18}$ atoms/cm$^3$ to $1\times10^{20}$ atoms/cm$^3$. If the dopant concentration is below $1\times10^{18}$ atoms/cm$^3$, source/drain regions 110 are unable to form a conductive path across channel layer 108, in some embodiments. If the dopant concentration is above $1\times10^{20}$ atoms/cm$^3$, source/drain regions 110 form a conductive path across channel layer 108 even if power cell 100 is not activated, in some embodiments.

Non-conductive regions 112 electrically separate source/drain regions 110 from first well 114. In some embodiments, non-conductive regions 112 are isolation features, such as shallow trench isolation (STI), local oxidation of silicon (LOCOS), or other suitable isolation features. In some embodiments, non-conductive regions 112 are undoped portions of channel layer 108. In some embodiments, non-conductive regions 112 are formed by etching channel layer 108 to form an opening and filling the opening with non-conductive material.

First well 114 comprises a region having the second dopant type. First well 114 electrically connects bottom gate 106 to resistor 122. First well 114 is disposed over isolation region 104. In some embodiments, first well 114 comprises an epi-layer grown over isolation region 104. In some embodiments, the epi-layer is doped by adding dopants during the epitaxial process. In some embodiments, the epi-layer is doped by ion implantation after the epi-layer is formed. In some embodiments, first well 114 is formed by doping substrate 102. In some embodiments, the doping is performed by ion implantation. In some embodiments, first well 114 has a dopant concentration ranging from $1\times10^{16}$ atoms/cm$^3$ to $1\times10^{18}$ atoms/cm$^3$. If the dopant concentration is below $1\times10^{16}$ atoms/cm$^3$, first well 114 does not provide sufficient conductivity to form a conductive path from bottom gate 106 to resistor 122 and bias source 124, in some embodiments. If the dopant concentration is above $1\times10^{18}$ atoms/cm$^3$, first well 114 would provide a path for current leakage from channel layer 108 to resistor 122, in some embodiments. In some embodiments, first well 114 has a same dopant concentration as bottom gate 106. In some embodiments, first well 114 has a dopant concentration higher than bottom gate 106.

Second well 116 comprises a region having the first dopant type. Second well 116 is disposed over isolation region 104 and around first well 114. In some embodiments, second well 116 comprises an epi-layer grown over isolation region 104. In some embodiments, the epi-layer is doped by adding dopants during the epitaxial process. In some embodiments, the epi-layer is doped by ion implantation after the epi-layer is formed. In some embodiments, second well 116 is formed by doping substrate 102. In some embodiments, the doping is performed by ion implantation. In some embodiments, second well 116 has a dopant concentration ranging from $1\times10^{12}$ atoms/cm$^3$ to $1\times10^{14}$ atoms/cm$^3$. If the dopant concentration is below $1\times10^{12}$ atoms/cm$^3$, second well 116 does not provide sufficient isolation between substrate 102 and first well 114, in some embodiments. If the dopant concentration is above $1\times10^{14}$ atoms/cm$^3$, second well 116 would provide a path for current leakage from first well 114 to substrate 102, in some embodiments. In some embodiments, second well 116 has a same dopant concentration as isolation region 104. In some embodiments, second well 116 has a dopant concentration higher than isolation region 104.

Gate dielectric layer 118 separates gate electrode 120 from channel layer 108. In some embodiments, gate dielectric layer 118 comprises a high-k dielectric material. A high-k dielectric material has a dielectric constant (k) higher than the dielectric constant of silicon dioxide. In some embodiments, the high-k dielectric material has a k value greater than 3.9. In some embodiments, the high-k dielectric material has a k value greater than 8.0. In some embodiments, gate dielectric layer 118 comprises silicon dioxide ($SiO_2$), silicon oxynitride (SiON), hafnium dioxide ($HfO_2$), zirconium dioxide ($ZrO_2$) or other suitable materials. In some embodiments, gate dielectric layer 118 has a thickness ranging from 60 Angstroms (Å) to 80 Å. If the thickness is less than 60 Å, gate dielectric layer 118 will break down if a high voltage is conducted through power cell 100, in some embodiments. If the thickness is greater than 80 Å, gate electrode layer 120 cannot efficiently activate charge transfer through channel layer 108, in some embodiments.

Gate electrode layer 120 is disposed over gate dielectric layer 118 and is configured to receive a signal to selectively activate charge transfer through channel layer 108. In some embodiments, gate electrode layer 120 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, the conductive material of gate electrode layer 120 is doped or undoped depending on design requirements of field effect transistor devices of an integrated circuit. In some embodiments, gate electrode layer 120 includes a work function layer tuned to have a proper work function for enhanced performance of the field effect transistor devices. For example, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In some embodiments, a conductive layer, such as an aluminum layer, is formed over the work function layer, such that the gate electrode includes a work function layer disposed over a gate dielectric layer and a conductive layer disposed over the work function layer.

Resistor 122 is positioned between first well 114 and bias source 124. Resistor is configured to increase a resistance along the electrical path between first well 118 and bias source 124 to reduce the risk of short circuits within power cell 100. In some embodiments, a resistance of resistor 122 is equal to or greater than 5K ohm-cm. If the resistance is less than 5K ohm-cm, resistor 122 does not provide sufficient resistance between first well 114 and bias source 124 to sufficiently reduce the risk of short circuits, in some embodiments. In some embodiments, resistor 122 comprises a polysilicon material.

Bias source 124 is connected to resistor 122 on an opposite side from first well 114. Bias source 124 is a reference voltage for power cell 100. In some embodiments, bias source 124 is ground. In some embodiments, bias source 124 is a negative voltage. In some embodiments, bias source 124 provides a voltage of about −10V.

Figure 2:
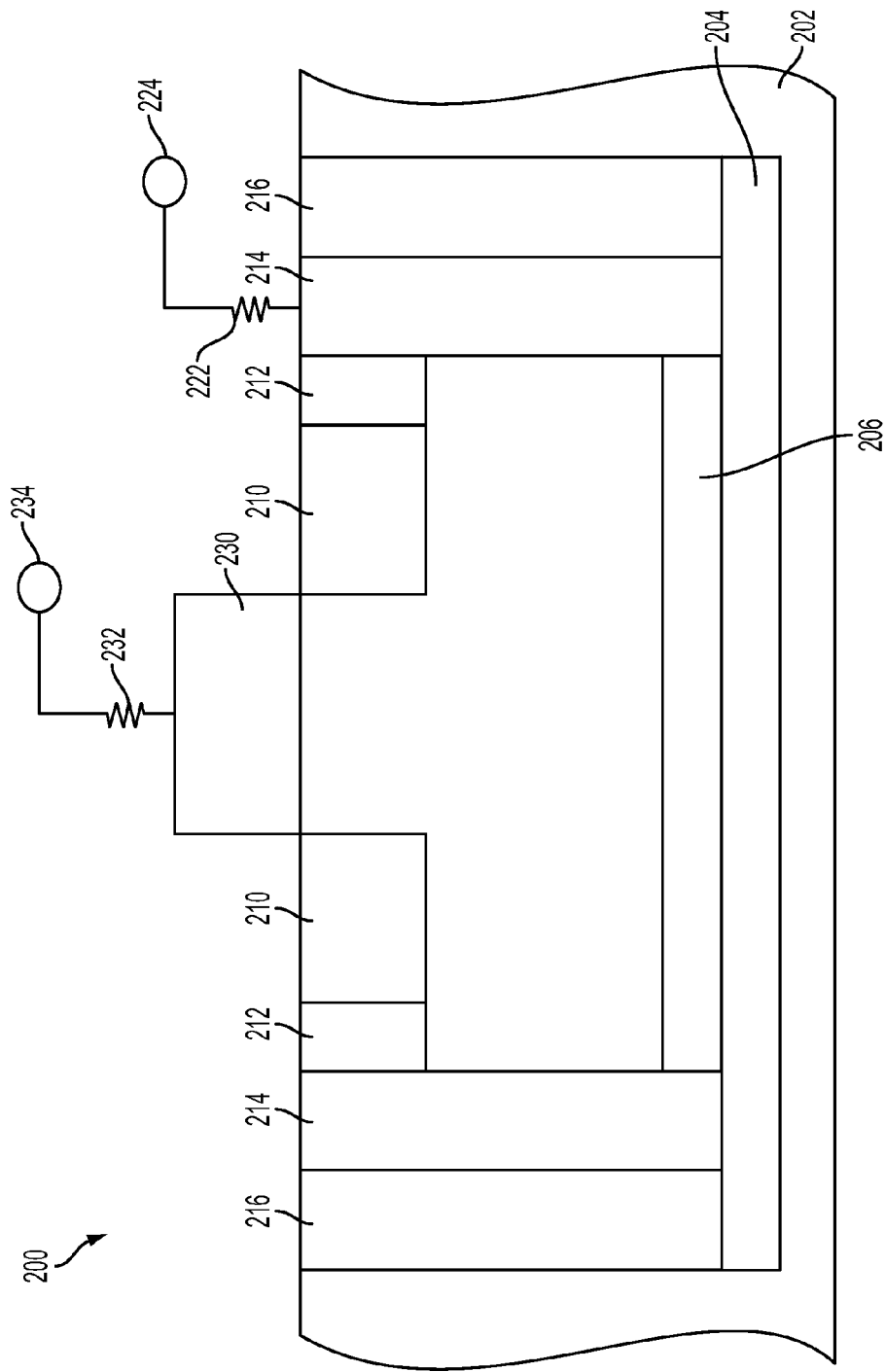
FIG. 2 is a cross sectional view of a power cell in accordance with one or more embodiments.

FIG. 2 is a cross-sectional view of a power cell 200 in accordance with one or more embodiments. Power cell 200 includes a substrate 202 and an isolation region 204 formed on the substrate. Power cell 200 further includes a bottom gate 206 formed on isolation region 204. Power cell 200 further includes a channel layer 208 formed on bottom gate 206. Source/drain regions 210 are formed on channel layer 208. Non-conductive regions 212 are formed on channel layer 208 between source/drain regions 210 and a first well 214. First well 214 is around an outer sidewall of non-conductive regions 212 and channel layer 208 and contacts the outer sidewall of the non-conductive regions and the channel layer. First well 214 is also around an outer sidewall of bottom gate 206 and contacts the outer sidewall of the bottom gate a top surface of isolation region 204. A second well 216 around an outer sidewall of first well 214 and contacts the outer sidewall of the first well and the top surface of isolation region 204. A resistor 222 has a first side connected to first well 214 and a second side connected to a bias source 224. Power cell 200 also includes a metal contact 230 formed over channel layer 208. Metal contact 230 and channel layer 208 form a Schottky diode. A resistor 232 has a first side connected to metal contact 230 and a second side connected to a bias source 234.

Isolation region 204, channel layer 208, source/drain regions 210 and second well 216 have a first dopant type. Bottom gate 206 and first well 214 have a second dopant type different from the first dopant type. In some embodiments, the first dopant type is an n-type dopant. In some embodiments, the first dopant type is a p-type dopant.

Power cell 200 includes similar features to those described with respect to power cell 100 above. Features in power cell 200 which are similar to features of power cell 100 have a same reference number as features in FIG. 1 increased by 100. In contrast to power cell 100, power cell 200 includes metal contact 230 which forms the Schottky diode with channel layer 108.

Metal contact 230 is electrically connected to channel layer 208 and a Schottky barrier is formed at an interface of the metal contact and the channel layer. In some embodiments, metal contact 230 comprises tungsten. In some embodiments, metal contact 230 comprises aluminum, copper, molybdenum, platinum, chromium, or other suitable metal material. In operation, metal contact 230 functions similar to a combination of gate electrode layer 120 and gate dielectric layer 118 to control charge transfer in channel layer 208.

Resistor 232 is similar to resistor 122. Resistor 232 is configured to increase a resistance along an electrical path between metal contact 230 and bias source 234 to reduce the risk of short circuits within power cell 200. In some embodiments, a resistance of resistor 232 is equal to or greater than 5K ohm-cm. If the resistance is less than 5K ohm-cm, resistor 232 does not provide sufficient resistance between metal contact 230 and bias source 234 to sufficiently reduce the risk of short circuits, in some embodiments. In some embodiments, resistor 232 comprises a polysilicon material.

Bias source 234 is similar to bias source 124. Bias source 234 is connected to resistor 232 on an opposite side from metal contact 230. Bias source 234 is a direct current bias for power cell 200. In some embodiments, bias source 234 is ground. In some embodiments, bias source 234 is a negative voltage. In some embodiments, bias source 234 provides a voltage of about −10V.

Figure 3:
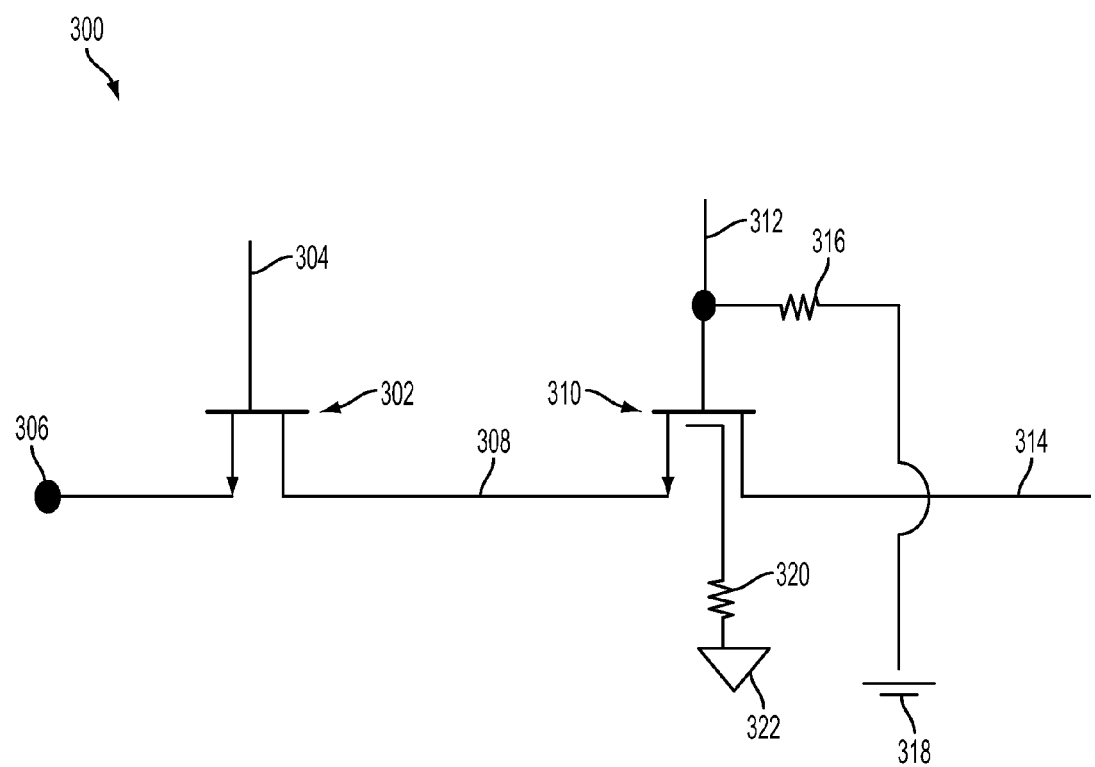
FIG. 3 is a schematic diagram of a power circuit in accordance with one or more embodiments.

FIG. 3 is a schematic diagram of a power circuit 300 in accordance with one or more embodiments. Power circuit 300 includes a first device 302 configured to receive a first input signal 304 and a supply voltage 306 and output a first output 308. Power circuit further includes a second device 310 configured to receive a second input signal 312 and first output 308 and output an output signal 314. Power circuit 300 further includes a first resistor 316 having a first side configured to receive second input signal 312 and a second side connected to a first bias source 318. Power circuit 300 further includes a second resistor 320 having a first side connected to second device 310 and a second side connected to a second bias source 322.

In some embodiments, first device 302 is power cell 100. In some embodiments, first device 302 is power cell 200. In some embodiments, first device 302 is a high voltage metal oxide semiconductor (MOS) transistor. First device 302 of power circuit 300 is an n-type device. In some embodiments, first device 302 is a p-type device. First device 302 is configured to be controlled by first input signal 304. In embodiments where first device 302 is power cell 100, first input signal 304 is received at gate electrode layer 120 to control charge transfer in channel layer 108. In embodiments where first device 302 is power cell 200, first input signal 304 is received at metal contact 230 to control charge transfer in channel layer 208.

First input signal 304 corresponds to a signal to be amplified by power circuit 300. In some embodiments, first input signal 304 is received from a signal source, e.g. a transceiver. Supply voltage 306 is the operating voltage of first device 302 and second device 310. In some embodiments supply voltage 306 is provided by a power supply circuit or other suitable circuitry.

In some embodiments, second device 310 is power cell 200. In some embodiments, second device 310 is power cell 200. Second device 310 of power circuit 300 is an n-type device. In some embodiments, second device 310 is a p-type device. Second device 310 is configured to be controlled by a second input signal 312. In embodiments where second device 310 is power cell 100, second input signal 312 is received at gate electrode layer 120 to control charge transfer in channel layer 108. In embodiments where second device 310 is power cell 200, second input signal 312 is received at metal contact 230 to control charge transfer in channel layer 208. In some embodiments, second device 310 has a same structure as first device 302. In some embodiments, second device 310 has a different structure from first device 302.

Second input signal 312 corresponds to the signal to be amplified by power circuit 300. In some embodiments, second input signal 312 is received from a signal source, e.g. a transceiver. In some embodiments, second input signal 312 is a same signal as first input signal 304. In some embodiments, second input signal 312 is different from first input signal 304. In embodiments where second input signal 312 is different from first input signal 304, circuitry positioned between the signal source and second device 310 modifies the first input signal to generate the second input signal.

Output signal 314 has a similar shape as the input signal, but has an increased power with respect to the input signal.

In some embodiments where second device 310 is power cell 100, first resistor 316 is connected to gate electrode layer 120. In some embodiments where second device 310 is power cell 100, first resistor 316 and first bias source 318 are omitted. In some embodiments where second device 310 is power cell 200, first resistor 316 is resistor 232 and first bias source 318 is bias source 234.

In some embodiments where second device 310 is power cell 100, second resistor 320 is resistor 122 and second bias source 322 is bias source 124. In some embodiments where second device 310 is power cell 200, second resistor 322 is resistor 222 and second bias source 322 is bias source 224.

The structure of power cells 100 and 200 and power circuit 300 provide advantages over other approaches because the features of the power cells and power circuit are capable of being formed using complementary metal oxide semiconductor (CMOS) process technology. In some approaches, electronic devices containing power amplifiers are formed using several different components formed using several different process technologies. For example, in a different approach, an electronic device includes a duplexer and a bandpass filter formed using micro electrical mechanical (MEMS) processing technology; a power amplifier formed using gallium arsenide (GaAs) processing technology and integrated circuits formed using CMOS technology. By forming the electronic device with a variety of processing technologies, complexity of the electronic device is increased because the different process technologies are connected to one another resulting in increased circuitry. The increased circuitry increases an overall size of the electronic device. The variety of processing technologies also increase production time and cost. The structure of power cells 100 and 200 and power circuit 300 allow the power amplifier to be formed using CMOS processing technology which reduces complexity of the electronic device and increases production efficiency.

The structure of power cells 100 and 200 and power circuit 300 also provides advantages over other approaches because the power cells are capable of handling higher voltages than the other approaches. In some embodiments, power cells 100 and 200 have a breakdown voltage greater than 12 V. The increased breakdown voltage in comparison with other approaches allows power cells 100 and 200 to replace devices formed using expensive specialized materials.

Figure 4:
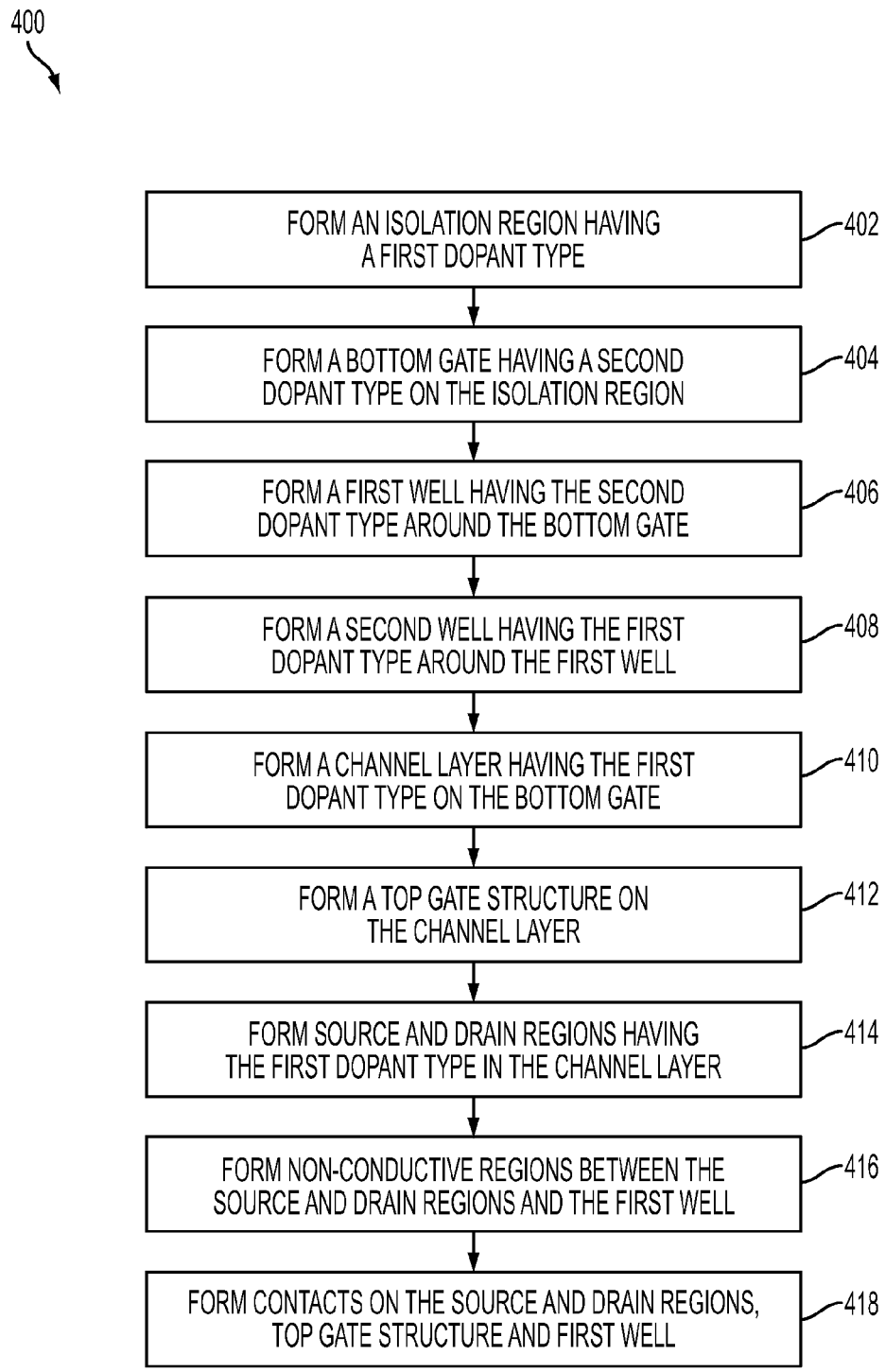
FIG. 4 is a flow chart of a method of making a power cell in accordance with one or more embodiments.

FIG. 4 is a flow chart of a method 400 of making a power cell in accordance with one or more embodiments. In operation 402, an isolation region having a first dopant type is formed. In some embodiments, the isolation region is formed by ion implantation in a portion of a substrate. In some embodiments, the isolation region is formed by epitaxially growing the isolation region on the substrate or other suitable processes.

In operation 404, a bottom gate having a second dopant type is formed on the isolation region. The second dopant type is opposite the first dopant type. In some embodiments, a dimension of the bottom gate in a direction parallel to a top surface of the substrate is shorter than a dimension of the isolation region in the direction parallel to the top surface of the substrate. In some embodiments, the bottom gate is formed by ion implantation. In some embodiments, the bottom gate is formed by epitaxially growing the bottom gate on the isolation region or other suitable processes.

In operation 406, a first well having the second dopant type is formed around the bottom gate. The first well is electrically connected to the bottom gate. In some embodiments, the first well has a dopant concentration equal to or greater than a dopant concentration of the bottom gate. In some embodiments, a bottom surface of the first well is in contact with a top surface of the isolation region. In some embodiments, the first well is formed by ion implantation. In some embodiments, the first well is formed by epitaxially growing the first well on the isolation region or other suitable processes.

In operation 408, a second well having the first dopant type is formed around the first well. The second well is electrically connected to the isolation region. In some embodiments, the second well is formed by ion implantation. In some embodiments, the second well is formed by epitaxially growing the second well on the isolation region or other suitable processes.

In operation 410, a channel layer having the first dopant type is formed on the bottom gate. The channel layer is surrounded by the first well. In some embodiments, the channel layer forms a three-dimensional channel. In some embodiments, the channel layer is formed by ion implantation. In some embodiments, the channel layer is formed by epitaxially growing the channel layer on the bottom gate or other suitable processes.

In operation 412, a top gate structure is formed on the channel layer. In some embodiments, the top gate structure comprises a gate dielectric layer and a gate electrode layer. In some embodiments, the top gate structure comprises a metal layer and the top gate structure and the channel layer form a Schottky diode. In some embodiments, the top gate structure is formed by chemical vapor deposition (CVD), physical vapor deposition (PVD), atomic layer deposition (ALD), sputtering, or other suitable deposition processes.

In operation 414, source and drain regions having the first dopant type are formed in the channel layer. A dopant concentration of the source and drain regions is higher than a dopant concentration of the channel layer. In some embodiments, the source and drain regions are formed by ion implantation. In some embodiments, the source and drain regions are formed by etching cavities in the channel layer and filling the cavities with materials for the source and drain regions or other suitable processes.

In operation 416, non-conductive regions are formed between the source and drain regions and the first well. The non-conductive regions electrically isolate the first well from the source and drain regions. In some embodiments, the non-conductive regions are formed by etching the channel layer to form cavities and filling the cavities with non-conductive materials or other suitable processes.

In operation 418, contacts are formed on the source and drain regions, the top gate structure and the first well. The contacts provide electrical connection points between the various components of the power cell and external circuitry. In some embodiments, the contacts are formed using a silicide process. In some embodiments, the contacts are formed using a salicide process. In some embodiments, the contacts are formed by CVD, PVD, ALD, sputtering or other suitable processes. In some embodiments, the contacts electrically connect the first well to a bias source through a first resistor. In some embodiments, the contacts electrically connect the top gate structure to an input signal. In some embodiments, the contacts electrically connect the top gate structure to an input signal through a second resistor. In some embodiments, the contacts electrically connect the source and drain regions to a supply signal and an output of the power cell.

One of ordinary skill in the art will recognize the order of the operations of method 400 described above is changed in some embodiments. In some embodiments, more than one operation is performed simultaneously. In some embodiments, additional operations are included. In some embodiments, at least one operation is omitted.

Figure 5:
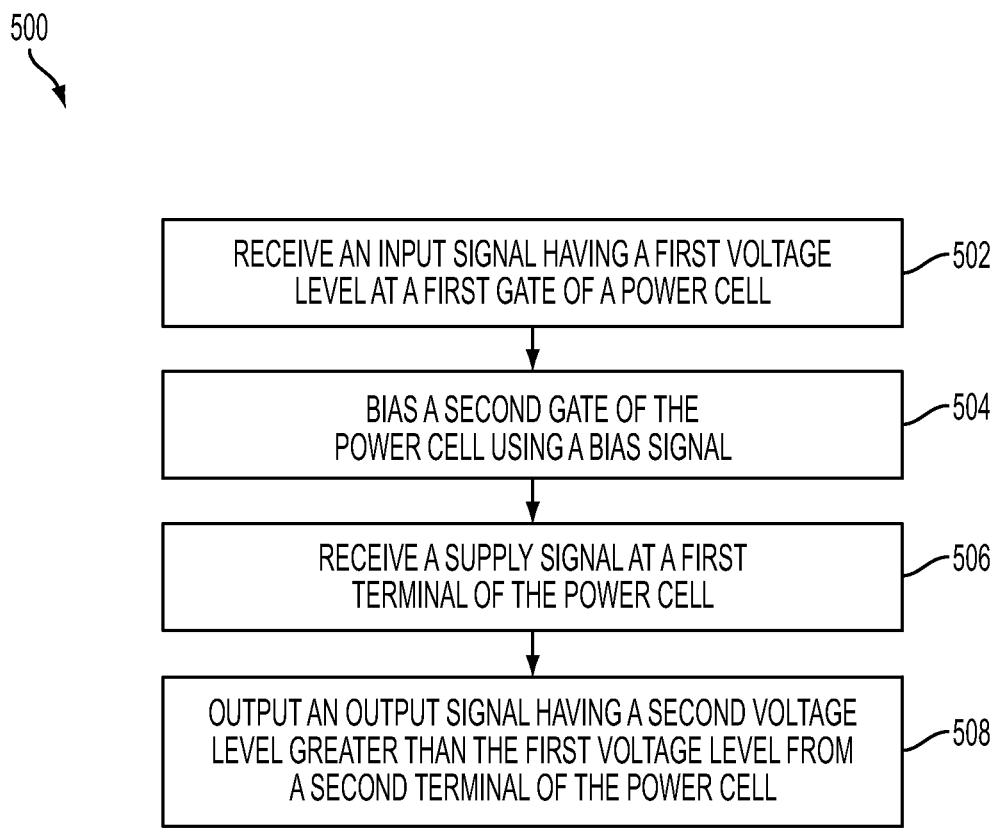
FIG. 5 is a flow chart of a method of using a power cell in accordance with one or more embodiments.

FIG. 5 is a flow chart of a method 500 of using a power cell in accordance with one or more embodiments. In operation 502, an input signal having a first voltage level is receive at a first gate of the power cell. The input signal will determine a resistance in the power cell. As the first voltage level increases, the resistance of the power cell decreases. In some embodiments, the input signal is received at gate electrode 120. In some embodiments, the input signal is received at metal contact 230. In some embodiments, the input signal is received through a resistor. In some embodiments, the resistor has a resistance greater than or equal to 5K ohm-cm.

In operation 504, a second gate of the power cell is biased using a bias signal. In some embodiments, the second gate is bottom gate 106. In some embodiments, the second gate is bottom gate 206. In some embodiments, the bias signal is received at first well 114 which is electrically connected to bottom gate 106. In some embodiments, the bias signal is receive at first well 214 which is electrically connected to bottom gate 206. In some embodiments, a resistor is positioned between a bias source supplying the bias signal and the power cell. In some embodiments, the resistor has a resistance greater than or equal to 5K ohm-cm.

In operation 506, a supply signal is received at a first terminal of the power cell. The supply signal has a supply voltage which is a maximum voltage to which the power cell amplifies the input signal. In some embodiments, the first terminal is a source of the power cell. In some embodiments, the first terminal is a drain of the power cell.

In operation 508, an output signal having a second voltage level greater than the first voltage level is output from a second terminal of the power cell. In some embodiments, the second terminal is the source of the power cell. In some embodiments, the second terminal is the drain of the power cell. The second voltage level is determined by the supply voltage and the resistance of the power cell. As the resistance of the power cell decreases, due an increase in the first voltage level, the second voltage level approaches the supply voltage.

One of ordinary skill in the art will recognize the order of the operations of method 500 described above is changed in some embodiments. In some embodiments, more than one operation is performed simultaneously. In some embodiments, additional operations are included. In some embodiments, at least one operation is omitted.

One aspect of this description relates to a power cell. The power cell includes an isolation region having a first dopant type formed in a substrate. The power cell further includes a bottom gate having a second dopant type different from the first dopant type formed on the isolation region and a channel layer having the first dopant type formed on the bottom gate. The power cell further includes source/drain regions having the first dopant type formed in the channel layer and a first well region having the second dopant type formed around the channel layer and the source/drain regions, and the first well region electrically connected to the bottom gate. The power cell further includes a second well region having the first dopant type formed around the channel layer and contacting the isolation region and a gate structure formed on the channel layer.

Another aspect of this description relates to a power circuit. The power circuit includes a first device, the first device configured to receive a power supply and a first input signal and to output a first output signal. The power circuit further includes a second device, the second device configured to receive a second input signal and the first output signal and to output a second output signal. The second device includes an isolation region having a first dopant type formed in a substrate. The second device further includes a bottom gate having a second dopant type different from the first dopant type formed on the isolation region and a channel layer having the first dopant type formed on the bottom gate. The second device further includes source/drain regions having the first dopant type formed in the channel layer and a first well region having the second dopant type formed around the channel layer and the source/drain regions, and the first well region electrically connected to the bottom gate. The second device further includes a second well region having the first dopant type formed around the channel layer and contacting the isolation region and a gate structure formed on the channel layer.

Still another aspect of this description relates to a power circuit. The power cell includes a substrate having a resistance equal to or greater than 5K ohm-cm and an isolation region having a first dopant type formed in the substrate. The power cell further includes a bottom gate having a second dopant type different from the first dopant type formed on the isolation region and a channel layer having the first dopant type formed on the bottom gate. The power cell further includes source/drain regions having the first dopant type formed in the channel layer and a first well region having the second dopant type formed around the channel layer and the source/drain regions, and the first well region electrically connected to the bottom gate. The power cell further includes non-conductive regions formed in the channel layer between the source/drain regions and the first well region and a second well region having the first dopant type formed around the channel layer and contacting the isolation region. The power cell further includes a gate structure formed on the channel layer and a resistor having a resistance equal to or greater than 5K ohm-cm electrically connected to the first well region.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A power cell comprising:
   an isolation region having a first dopant type in a substrate;
   a bottom gate having a second dopant type different from the first dopant type on the isolation region;
   a channel layer having the first dopant type on the bottom gate;
   source/drain regions having the first dopant type on the channel layer, wherein the channel layer is physically continuous between the source/drain regions;
   a first well region having the second dopant type around the channel layer and the source/drain regions, the first well region electrically connected to the bottom gate;
   a second well region having the first dopant type around the channel layer and contacting the isolation region; and
   a gate structure on the channel layer, wherein the gate structure comprises:
      a gate dielectric layer, wherein a bottom-most surface of the gate dielectric layer is on a top-most surface of the channel layer, and the gate dielectric layer exposes an entirety of the source/drain regions, and
      a gate electrode over the gate dielectric layer.

2. The power cell of claim 1, wherein the first dopant type is an n-type dopant and the second dopant type is a p-type dopant.

3. The power cell of claim 1, wherein the gate dielectric layer has a thickness ranging from 60 Angstroms (Å) to 80 Å.

4. The power cell of claim 1, further comprising:
   a resistor having a first side electrically connected to the first well region; and
   a bias source electrically connected to a second side of the resistor.

5. The power cell of claim 4, wherein the resistor has a resistance greater than or equal to 5K ohm-cm.

6. The power cell of claim 1, wherein the substrate has a resistance greater than or equal to 5K ohm-cm.

7. The power cell of claim 1, further comprising non-conductive regions between the source/drain regions and the first well region.

8. The power cell of claim 1, wherein a dopant concentration of the first well region is equal to or greater than a dopant concentration of the bottom gate.

9. The power cell of claim 1, wherein the channel layer, the source/drain regions, the gate structure and the bottom gate form a three-dimensional channel.

10. The power cell of claim 1, wherein the gate dielectric layer comprises a dielectric material having a dielectric constant higher than a dielectric constant of silicon dioxide.

11. The power cell of claim 10, wherein the dielectric constant of the dielectric material is greater than 3.9.

12. A power circuit comprising:
   a first device, the first device configured to receive a power supply and a first input signal and to output a first output signal; and
   a second device, the second device configured to receive a second input signal and the first output signal and to output a second output signal, the second device comprising:
      an isolation region having a first dopant type in a substrate;
      a bottom gate having a second dopant type different from the first dopant type on the isolation region;
      a channel layer having the first dopant type on the bottom gate;
      source/drain regions having the first dopant type on the channel layer, wherein the source/drain regions have a top surface substantially level with a top surface of the channel layer;
      a first well region having the second dopant type around the channel layer and the source/drain regions, the first well region electrically connected to the bottom gate;
      a second well region having the first dopant type around the channel layer and contacting the isolation region;
      a gate structure on the top surface of the channel layer, wherein the gate structure is on an upper-most surface of the channel layer; and
      a first resistor electrically connected between the first well region and a first bias source.

13. The power circuit of claim 12, wherein the first input signal and the second input signal are the same.

14. The power circuit of claim 12, wherein the first input signal is different from the second input signal.

15. The power circuit of claim 12, further comprising a second resistor electrically connected to the gate structure of the second device configured to receive the second input signal.

16. The power circuit of claim 12, wherein a resistance of the first resistor is equal to or greater than 5K ohm-cm.

17. The power circuit of claim 12, wherein the gate structure comprises:
   a gate dielectric layer over the channel layer; and
   a gate electrode over the gate dielectric layer.

18. The power circuit of claim 12, wherein the gate structure comprises a metal layer and the metal layer and the channel layer form a Schottky diode.

19. The power circuit of claim 12, wherein the first device comprises:
   a second isolation region having the first dopant type in the substrate;

a second bottom gate having the second dopant type on the second isolation region;

a second channel layer having the first dopant type on the second bottom gate;

second source/drain regions having the first dopant type on the second channel layer;

a second first well region having the second dopant type around the second channel layer and the second source/drain regions, and the second first well region electrically connected to the second bottom gate;

a second second well region having the first dopant type around the second channel layer and contacting the isolation region; and a second gate structure on the second channel layer.

20. A method of making a power cell, the method comprising:

forming an isolation region having a first dopant type;

forming a bottom gate having a second dopant type different from the first dopant type on the isolation region;

forming a channel layer having the first dopant type on the bottom gate;

forming a gate dielectric layer over the channel layer;

forming a gate electrode over the gate dielectric layer;

forming source/drain regions having the first dopant type in the channel layer, wherein sidewalls of the source/drain regions directly contact the channel layer, and the gate dielectric layer exposes an entirety of the source/drain regions;

forming a first well region having the second dopant type around the channel layer and the source/drain regions, the first well region electrically connected to the bottom gate;

forming a second well region having the first dopant type around the channel layer and contacting the isolation region; and forming a gate structure on the channel layer, wherein a bottom surface of the gate structure is above a top surface of the source/drain regions.

21. The method of claim 20, wherein the first dopant type is an n-type dopant and the second dopant type is a p-type dopant.

22. The method of claim 20, wherein forming the gate dielectric layer comprises forming the gate dielectric layer having a thickness ranging from 60 Angstroms (Å) to 80 Å.

23. The method of claim 20, further comprising:

electrically connecting a resistor to the first well region.

24. The method of claim 20, further comprising forming non-conductive regions between the source/drain regions and the first well region.

25. The method of claim 20, wherein forming the first well region comprises forming the first well region having a dopant concentration equal to or greater than a dopant concentration of the bottom gate.

26. The method of claim 20, wherein forming the channel layer, the source/drain regions, the gate structure and the bottom gate comprises forming a three-dimensional channel.

27. The method of claim 20, wherein forming the gate dielectric layer comprises forming a dielectric material having a dielectric constant higher than a dielectric constant of silicon dioxide.

28. A method of amplifying a voltage level of an input signal using a power cell, the method comprising:

receiving the input signal having a first voltage level at a first gate of the power cell, wherein the power cell comprises:

an isolation region having a first dopant type in a substrate;

a bottom gate having a second dopant type different from the first dopant type on the isolation region;

a channel layer having the first dopant type on the bottom gate;

source/drain regions having the first dopant type on the channel layer;

a first well region having the second dopant type around the channel layer and the source/drain regions, the first well region electrically connected to the bottom gate;

a second well region having the first dopant type around the channel layer and contacting the isolation region; and a gate structure on a top-most surface of the channel layer, wherein the gate structure does not overlap the source/drain regions;

supplying a bias signal through a first resistor to the first well region;

receiving a supply signal at a first terminal of the power cell; and outputting an output signal having a second voltage level greater than the first voltage level from a second terminal of the power cell.

29. The method of claim 28, wherein receiving the input signal at the first gate comprises receiving the input signal at a gate comprising:

a gate dielectric layer over the channel layer; and a gate electrode over the gate dielectric layer.

30. The method of claim 28, wherein receiving the input signal at the first gate comprises receiving the input signal at a gate comprising: a metal layer over the channel layer, wherein the metal layer and the channel layer form a Schottky diode.

31. The method of claim 28, wherein supplying the bias signal through the first resistor comprises supplying the bias signal through the first resistor having a resistance greater than or equal to 5K ohm-cm.

32. The method of claim 28, wherein receiving the input signal at the first gate comprises receiving the input signal through a second resistor.

33. The method of claim 32, wherein receiving the input signal through the second resistor comprises receiving the input signal through the second resistor having a resistance greater than or equal to 5K ohm-cm.

34. The method of claim 28 further comprising:

supplying the bias signal through the first resistor and the first well region to the bottom gate.

35. The method of claim 28, wherein receiving the input signal at the first gate comprises receiving the input signal at a gate electrode over a gate dielectric layer, the gate dielectric layer comprises a dielectric material having a dielectric constant greater than 3.9.

* * * * *